United States Patent [19]

Bullock et al.

[11] Patent Number: 4,760,332
[45] Date of Patent: Jul. 26, 1988

[54] PHASE LAG AND LIGHT-LOAD ADJUST FOR VOLTAGE STATOR

[75] Inventors: Donald F. Bullock; Harold L. Stucker, both of Somersworth; Ansell W. Palmer, Hampton, all of N.H.

[73] Assignee: General Electric Company, Somersworth, N.H.

[21] Appl. No.: 793,124

[22] Filed: Oct. 30, 1985

[51] Int. Cl.$^4$ ............................................. G01R 11/02
[52] U.S. Cl. ................................................. 324/138
[58] Field of Search ................ 324/137, 138; 310/105, 310/254

[56] References Cited

U.S. PATENT DOCUMENTS

| 2,874,476 | 3/1959 | Hallbauer | 324/138 |
| 3,688,192 | 8/1972 | Ramsey, Jr. | 324/137 |
| 4,547,730 | 10/1985 | Morong | 324/137 |
| 4,649,337 | 3/1987 | Stucker | 324/138 |

Primary Examiner—Reinhard J. Eisenzopf
Assistant Examiner—Walter E. Snow
Attorney, Agent, or Firm—Robert E. Brunson; Thomas R. Morrison

[57] ABSTRACT

A kilowatthour meter includes a voltge stator having a phase lag and light-load adjust assembly which permits smooth adjustment of its phase lag adjust and its light-load adjust from either end of the voltage stator. Each adjustment provides the same effect on the speed of the rotatable disk of the kilowatthour meter. The end of the voltage stator from which adjustment may be performed is established by selectably engaging adjustment screws in the accessible ends of the phase lag adjust and light-load adjust. Thus, voltage stators installed in either left or right positions on the kilowatthour meter are identical except for the ends into which the adjustment screws are installed being the only difference.

2 Claims, 2 Drawing Sheets

PHASE LAG AND LIGHT-LOAD ADJUST FOR VOLTAGE STATOR

BACKGROUND OF THE INVENTION

The present invention relates to metering equipment and, more particularly, to electric watthour or kilowatthour meters.

Electric watthour or kilowatthour meters conventionally employ a metallic disk rotated by flux generated by opposed voltage and current stators disposed adjacent opposed surfaces of the disk against a magnetic drag. Polyphase kilowatthour meters measure the power and energy in two or more phases fed to a load by employing two or more sets of voltage and current stators angularly spaced about the disk.

In a kilowatthour meter having two sets of voltage and current stators, it is conventional to position a first of the sets on one side of the disk and the second of the sets on the other side of the disk.

It is conventional to perform several adjustments on the voltage and current stators, either in the factory or in the field, to calibrate the instrument. Two types of adjustment of interest to the present invention include phase lag adjustment and light-load adjustment on the voltage stator.

Conventional phase lag adjustment is performed at rated current and a power factor of 0.5 to adjust the disk rotational speed under these conditions. In one technique, a one-turn conductive loop of, for example, copper, encircles a substantial part of the flux passing between the core of the voltage stator and the disk. A phase lag plate built into the loop includes perforations joined by webs. A selected number of the webs are severed to adjust the ratio of reactance to resistance in the one-turn loop and thus to adjust the phase of the flux applied to the disk by the voltage stator with respect to the phase of the flux applied to the disk by the current stator.

The above conventional phase lag plate adjustment suffers from the incremental nature of the adjustment and the fact that, once severed, a web cannot be rejoined.

The incremental adjustment forces compromises between conflicting desires to obtain both a wide adjustment range and fine adjustment resolution. Such compromises usually result in a minimum adjustment step size of about 0.5 percent of disk speed. This limits the accuracy with which disk speed can be controlled in the presence of lagging power factor.

The irreversible nature of the adjustment not only makes field phase lag adjustment unavailable, but it also makes an adjustment error unforgiving. If one too many webs is severed, the kilowatthour meter must be withdrawn from production until a new phase lag plate is installed. Then the adjustment must be performed anew.

A vernier phase lag adjustment technique is disclosed in U.S. patent application Ser. No. 711,718 filed Mar. 14, 1985 now matured into U.S. Pat. No. 4,649,337 in which the variable resistance of the phase lag plate is replaced with a variable inductance consisting of a small number of turns of a copper coil closely wrapped by a plate of magnetic iron. The ratio of resistance to inductance in the one-turn phase lag loop encircling the flux passing between the voltage stator pole and the disk is smoothly controlled by adjusting the penetration of a steel adjustment screw along the axis of the copper coil.

As seen from the front of a kilowatthour meter, the voltage stator located at the left of the kilowatthour meter is rotated 180 degrees from the voltage stator located at the right of the kilowatthour meter. The standards of the American National Standards Association (ANSI), which govern kilowatthour metering equipment, require that adjustments should be accessible from the front of the kilowatthour meter and that a clockwise control adjustment on the voltage stator located at the left side of the kilowatthour meter should have the same effect on disk speed as a clockwise adjustment of a corresponding control on the voltage stator located at the right side of the kilowatthour meter. In the case of the referenced phase lag-adjustment device described in the preceding paragraphs, corresponding threaded holes are disposed at each end of the adjustment coil for permitting the adjustment screw to be inserted with its head facing in either direction. Thus, by selecting the end of the adjustment coil into which the adjustment screw is inserted, the same voltage stator may have its phase lag adjustment performed in the same direction, with the same direction of rotation of the adjustment screw, regardless of whether it is located on the left or the right side of the kilowatthour meter. That is, since advancing the adjustment screw into the adjustment coil increases the inductance in the phase lag loop, a clockwise adjustment of the adjustment screw has the same effect on disk speed in each location, as required by the ANSI standard.

A light-load adjustment on a voltage stator conventionally consists of a loop of magnetic or conductive material disposed between the pole of tha voltage stator and the disk. The loop is adjusted in a direction parallel to the disk and normal to a radius of the disk to adjust the disk speed at 10 percent rated current and unity power factor. The loop is conventionally moved by an adjustment screw. In order to provide the same adjustment effect in either left or right locations, it is conventional to use two different voltage stators: one with a light-load adjustment employing an adjustment screw with a right-hand thread; and the other with a light-load adjustment employing an adjustment screw with a left-hand thread. This permits locating voltage stators in left and right positions about the disk while providing the same rotational adjustment direction for the same adjustment of disk speed.

Different voltage stators, each requiring different parts which must be designed, manufactured and stocked, represent a significant increase in initial and continuing cost to both the manufacturer and the utility customer. It is thus desirable to avoid doubling the number of different voltage stator designs required to permit identical adjustment of left and right light-load adjustments. One approach to this objective is disclosed in U.S. patent application Ser. No. 590,973 filed Mar. 19, 1984, of common assignee with the present invention, which details a screw-type light-load adjust permitting adjustment from either side of the disk by merely changing the end of the light-load adjust into which the adjustment screw is inserted.

This referenced patent application, besides being of significantly different structure from the present application, lacks the additional integration of both light-load and phase lag adjustments, both of which may selectably be performed with the voltage stator installed in either the left or right positions, as viewed from the front of the kilowatthour meter.

OBJECTS AND SUMMARY OF THE INVENTION

It is an object of the invention to provide a voltage stator for a kilowatthour meter which overcomes the drawbacks of the prior art.

It is a further object of the invention to provide a voltage stator for a kilowatthour meter which permits smooth adjustment of both the phase lag and light load adjustments from the front of the kilowatthour meter wherein rotational adjustment directions produce the same change in disk speed regardless of whether the voltage stator is disposed at the left or the right of the kilowatthour meter disk.

Briefly stated, the present invention provides a voltage stator for a kilowatthour meter having a phase lag and light-load adjust assembly which permits smooth adjustment of its phase lag adjust and its light-load adjust from either end of the voltage stator. Each adjustment provides the same effect on the speed of the rotatable disk of the kilowatthour meter. The end of the voltage stator from which adjustment may be performed is established by selectably engaging adjustment screws in the accessible ends of the phase lag adjust and light-load adjust. Thus, voltage stators installed in either left or right positions on the kilowatthour meter are identical except for the ends into which the adjustment screws are installed being the only difference.

According to an embodiment of the invention, there is provided a phase lag and light-load adjust assembly for a voltage stator of a kilowatthour meter comprising a phase lag adjust affixed to the voltage stator, a light-load adjust affixed to the voltage stator, the phase lag adjust including a phase lag adjustment screw, first means for permitting the phase lag adjustment screw to be inserted in either end of the phase lag adjust, the light-load adjust including a light-load adjustment screw, second means for permitting the light-load adjustment screw to be inserted in either end of the light-load adjust, whereby a single type of voltage stator is conformable for both phase lag and light-load adjustment from either end of the voltage stator.

According to a feature of the invention, there is provided a light-load adjust for a voltage stator of a kilowatthour meter comprising a right-angled flange rigidly affixed to the voltage stator having a first threaded hole therein, a light load adjust plate, means for permitting slidable motion of the light-load adjust plate with respect to the voltage stator, a light-load adjust nut rigidly affixed to the light-load adjust plate and having a second threaded hole therein generally aligned with the first threaded hole, the first and second threaded holes having substantially equal diameters and thread pitches, resilient means biasing apart the right-angled flange and the light-load adjust nut, a light-load adjustment screw having a shaft, a head and a threaded end, the threaded end being selectively engageable with the first and second threaded holes, the shaft having a diameter substantially smaller than a diameter of the threaded end, the light-load adjustment screw being insertable into either end of the light-load adjust by threading the shaft completely through either one of the first and second threaded holes and into the other thereof, the smaller diameter of the shaft being effective to avoid interference with adjustment, a spring finger having first and second ends, means for rigidly affixing the first end to the voltage stator and means at the second end for resiliently bearing against an edge of the light-load adjust plate at an angle diagonal to a plane of the light-load adjust plate, the diagonal angle being effective for displacing the light-load adjust plate in a transverse direction and for rotating the light load adjust plate with respect to the means for permitting slidable motion whereby adjustment backlash is avoided and a stable adjustment is attained.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
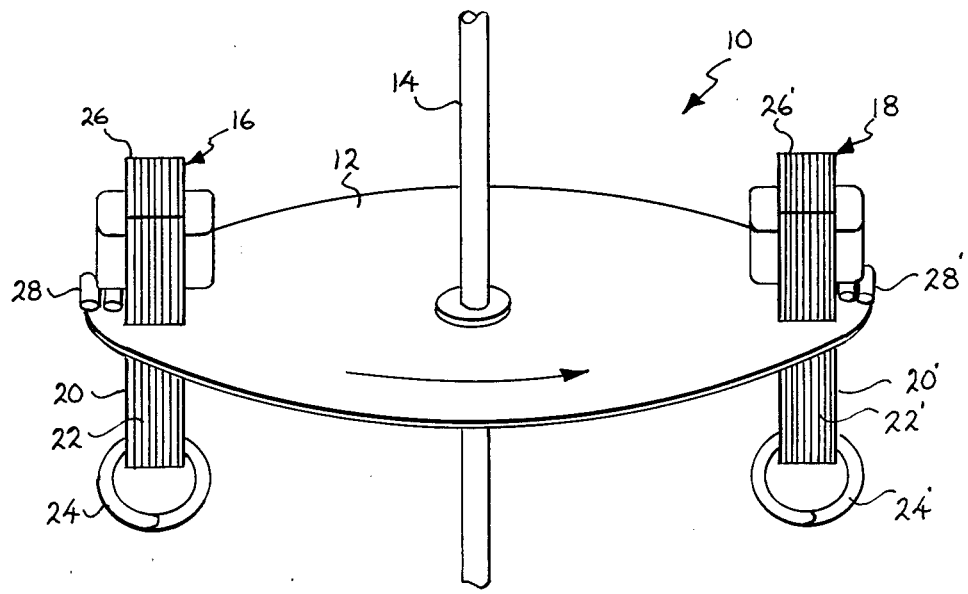
FIG. 1 is a perspective view of a portion of a polyphase kilowatthour meter according to an embodiment of the invention.

Referring to FIG. 1, a polyphase kilowatthour meter, shown generally at 10, includes a rotatable disk 12 of a conductive material such as, for example, aluminum, rotatably supported on a shaft 14. A first set of voltage and current stators 16 is disposed at one side of rotatable disk 12 and a second set of voltage and current stators 18 is disposed, angularly spaced from first set of voltage and current stators 16 by about 180 degrees, at the other side of rotatable disk 12.

First set of voltage and current stators 16 is representative, and will be described in detail.

A current stator 20 faces one surface of rotatable disk 12. Current stator 20 includes a magnetic core 22 through which is wound a small number of turns of a current stator coil 24. Although current stator 20 represents a part of the environment in which the present invention operates, it does not constitute an inventive part of the present disclosure. A further description of current stator 20, and its counterpart current stator 20' in set of voltage and current stators 18, is omitted from the following.

A voltage stator 26, in set of voltage and current stators 16, faces a second surface of rotatable disk 12 opposed to current stator 20. Similarly, a second voltage stator 26', in set of voltage and current stators 18, faces the second surface of rotatable disk 12 opposed to current stator 20'. A phase lag and light-load adjust assembly 28 is disposed at a radially outer location on voltage stator 26. A similar phase lag and light-load adjust assembly 28' is disposed at a radially outer location on voltage stator 26'.

As is conventional, in order for both voltage stator 26 and voltage stator 26' to contribute rotational torque to rotatable disk 12 in the same rotational direction such as, for example, the counterclockwise direction indicated by a curved arrow, voltage stator 26' must be rotated 180 degrees from voltage stator 26 as seen from the front of kilowatthour meter 10. As a consequence, the end of phase lag and light-load adjust assembly 28 which is accessible for adjustment by a person positioned in front of kilowatthour meter 10 is opposite to the accessible end of phase lag and light-load adjust assembly 28'.

Figure 2:
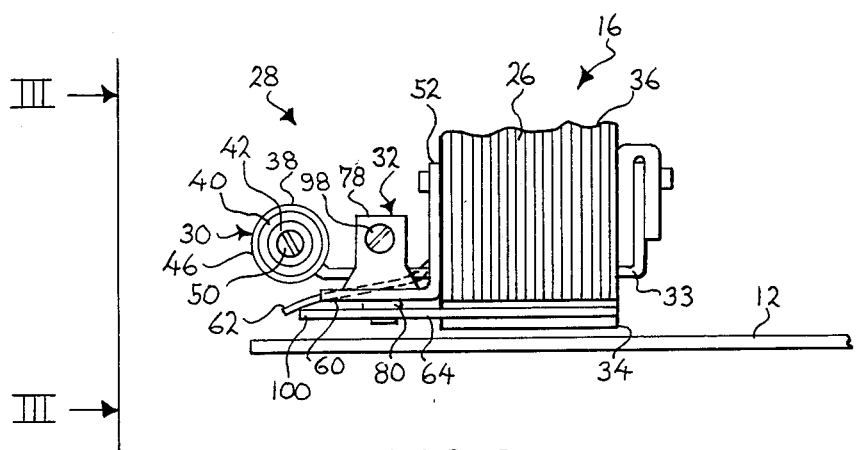
FIG. 2 is a close-up end view of a voltage stator of the polyphase kilowatthour meter of FIG. 1.

Referring now to FIG. 2, phase lag and light load adjust assembly 28 includes a phase lag adjust 30 and a light-load adjust 32 spaced outward from each other adjacent voltage stator 26. Phase lag adjust 30, which corresponds to the device disclosed in detail in one U.S. Pat. No. 4,649,337 includes a one-turn loop 33 which encircles a center leg 34 of an E-shaped core 36 of voltage stator 26. Substantially all of the flux from voltage stator 26 which interacts with rotatable disk 12, passes through one-turn loop 33.

Figure 3:
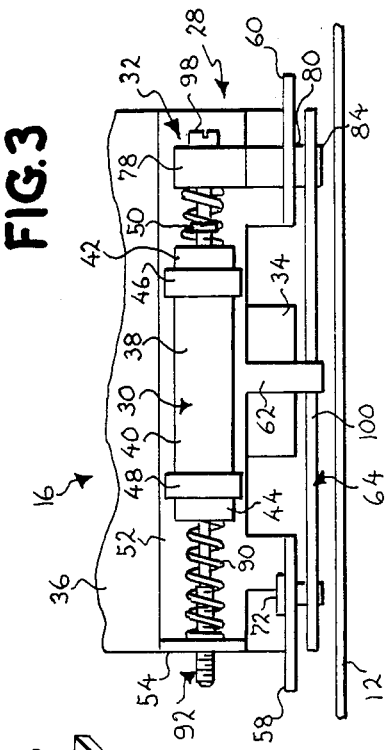
FIG. 3 is a side view of the voltage stator of FIG. 2.

Referring now also to FIG. 3, one-turn loop 33 includes an inductor 38 containing a coil (not shown) of heavy copper conductor enclosed in a wrapper 40 of magnetic material. The cylindrical shape of wrapper 40 is established by a pair of cylindrical bushings 42 and 44. Wrapper 40 is clamped in place upon the perimeters of cylindrical bushings 42 and 44 by clamping bands 46 and 48. Each of cylindrical bushings 42 and 44 includes a threaded hole (not shown) centrally located therein and aligned with a central axis of phase lag adjust 30. A phase lag adjustment screw 50, of a magnetic material, preferably steel, is threaded into a selected one of the threaded holes in cylindrical bushings 42 or 44. The end of inductor 38, into which phase lag adjustment screw 50 is threaded, is selected to permit adjustment of phase lag adjust 30 from the front of kilowatthour meter 10. However, advancing phase lag adjustment screw 50 into inductor 38 from either end increases the inductance of inductor 38 and thus has the same effect on disk speed. Therefore, the same phase lag adjust 30 may be employed in either voltage stator 26 or voltage stator 26' (FIG. 1) by selecting the appropriate end of inductor 38 into which phase lag adjustment screw 50 is engaged. Thus, a single design of phase lag adjust 30 is suitable to accommodate the phase lag adjustment of voltage stator 26 in both left and right locations.

Figure 4:
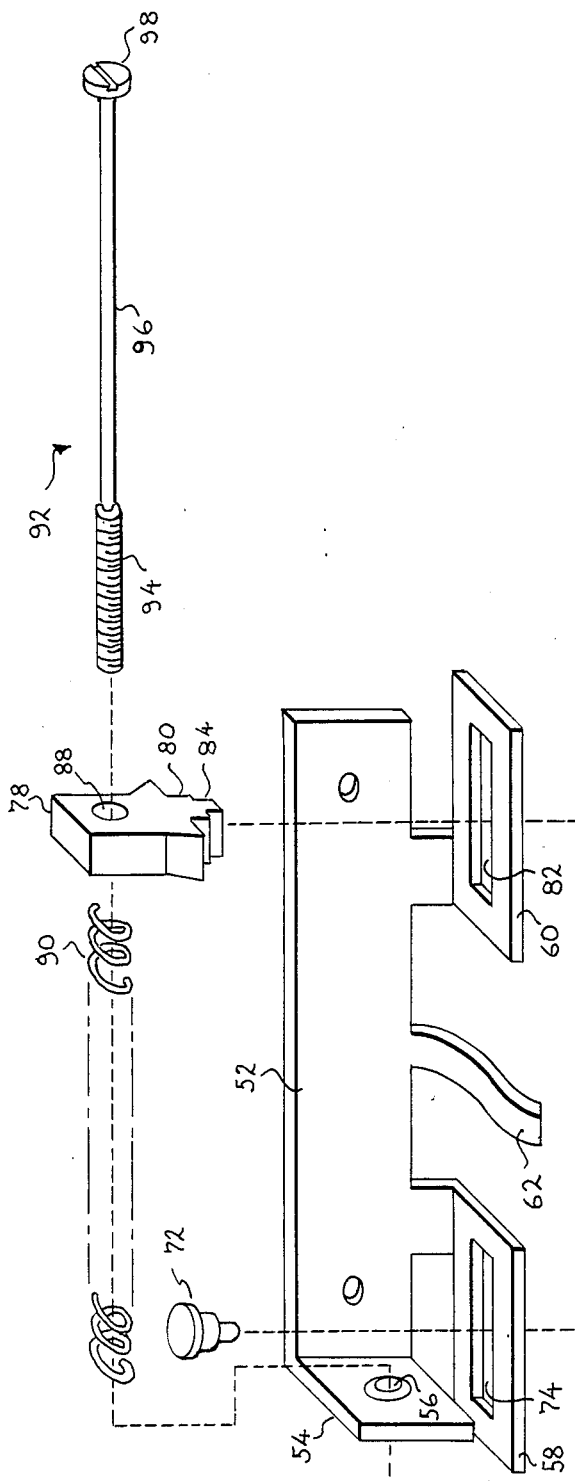
FIG. 4 is an exploded perspective view of the light-load adjust of FIGS. 2 and 3.

Referring now also to the exploded view in FIG. 4, light-load adjust 32 includes a support plate 52 rigidly affixed to E-shaped core 36 and having a right-angled flange 54 at one end thereof. A threaded hole 56 is centrally disposed in right-angled flange 54. First and second guide plates 58 and 60 are suspended at right angles to support plate 52. A spring finger 62, integrally formed with support plate 52, extends generally in the same direction as guide plates 58 and 60.

A light-load adjust plate 64, preferably of stainless steel, and most preferably of magnetic stainless steel, is slidably disposed below guide plates 58 and 60. Light-load adjust plate 64 includes a bar 66 and first and second light-load tabs 68 and 70. A shouldered guide rivet 72 passes guidingly through a guide slot 74 in guide plate 58 and into a hole 76 in light-load adjust plate 64. Guide rivet 72 is rigidly affixed in hole 76 by any convenient means such as, for example, peening or welding.

A light-load adjust nut 78 includes a shoulder portion 80 which passes guidingly through a guide slot 82 in guide plate 60, and a reduced-width portion 84 which fits into a slot 86 in light-load adjust plate 64. Reduced-width portion 84 is rigidly affixed in slot 86 by any convenient means such as, for example, peening or welding. A threaded hole 88 is disposed in light-load adjust nut 78 with its axis generally aligned with an axis of threaded hole 56 of right-angled flange 54.

Although the preferred embodiment employs light-load tabs 68 and 70 of generally rectangular shape, one skilled in the art would recognize that corresponding results are obtainable using shapes other than rectangular. In addition, the present invention also contemplates that a rectangular window-type plate supported and adjusted in the disclosed manner may be substituted for light-load adjust plate 64 without departing from the spirit and scope of the invention.

A helical spring 90 is disposed between right-angled flange 54 and light-load adjust nut 78 tending to urge them apart. A light-load adjustment screw 92 is positioned along the axis of helical spring 90 thus tending to retain helical spring 90 in position, thereby permitting adjustment of light-load adjust 32.

Light-load adjustment screw 92 includes a threaded end 94 with a shaft 96 connecting threaded end 94 to a head 98. The diameter and thread pitch of threaded end 94 match those of threaded holes 56 and 88. It will be noted, however, that the diameter of shaft 96 is substantially smaller than the diameter of threaded end 94 (the difference is exaggerated in FIG. 4).

Light-load adjustment screw 92 may be installed in the direction shown in FIGS. 2–4 by threading threaded end 94 along the axis of helical spring 90 through threaded hole 88 until threaded end 9 is free of light-load adjust nut 78. Shaft 96 is then slipped through threaded hole 88 along the axis of helical spring 90 until threaded end 94 engages threaded hole 56. Since the diameter of shaft 96 is substantially smaller than the diameter of threaded hole 88, shaft 96 does not interfere with subsequent operations. Continued adjustment of threaded end 94 into threaded hole 56 brings head 98 into contact with light-load adjust nut 78. Further adjustment of threaded end 94 into threaded hole 56 urges light load adjust nut 78, as well as bar 66, leftward in FIGS. 3 and 4 until the positions attained by light load tabs 68 and 70 provide the desired correction for light-load errors.

The above setup for light-load adjust 32 is satisfactory for set of voltage and current stators 16 (FIG. 1). In set of voltage and current stators 18 (FIG. 1), light-load adjustment screw 92 is first threaded through threaded hole 56, then advanced along the axis of helical spring 90 and threaded into threaded hole 88. It will be noted that continued advance of threaded end 94 into threaded hole 88 again produces leftward movement of light-load adjust plate 64 in FIGS. 3 and 4. Thus, the same light-load adjustment screw 92 is capable of producing the same direction of adjustment in both set of voltage and current stators 16 and set of voltage and current stators 18. As a consequence, the same light-load adjust 32 can be used in set of voltage and current stators 16 and set of voltage and current stators 18 by selecting the appropriate direction in which light-load adjustment screw 92 is inserted.

Spring finger 62 reduces backlash in the adjustment of light-load adjust 32 and improves adjustment stability in the presence of thermal changes and mechanical shock. Spring finger 62 contacts an outer edge 100 of light-load adjust plate 64 at an angle to the plane of light-load adjust plate 64. The point of contact is disposed outward from the retention areas where shouldered guide rivet 72 and light-load adjust nut 78 are affixed to light load adjust plate 64. Thus, the urging of spring finger 62 tends to displace light-load adjust plate 64 toward E-shaped core 36 and to rotate light-load tabs 68 and 70 into contact with the outer legs o E-shaped core 36.

Since both phase lag adjust 30 and light-load adjust 32 are conformable for adjustment from either end of voltage stator 26, only one type of part must be designed, stocked and catalogued instead of the two different parts heretofore necessary. In either location, fine and continuous adjustment of both phase lag and light load are provided with the adjustments accessible from the front of the meter. Also, adjustment in a given direction imposes the same effect on disk speed in both left and right locations. Thus, the combination of phase lag adjust and light-load adjust 32, according to the present invention, provides a phase lag and light-load adjust assembly 28 offering benefits which are not present if only one of them is used alone.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A light-load adjust for a voltage stator of a kilowatthour meter comprising:
   a flange rigidly affixed to said voltage stator having a first threaded hole therein;
   a light-load adjust plate;
   means for permitting slidable motion of said light-load adjust plate with respect to said voltage stator;
   a light-load adjust nut rigidly affixed to said light-load adjust plate and having a second threaded hole therein generally aligned with said first threaded hole;
   said first and second threaded holes having substantially equal diameters and thread pitches;
   resilient means biasing apart said flange and said light-load adjust nut;
   a light-load adjustment screw having a shaft, a head and a threaded end;
   said threaded end being selectively engageable with said first and second threaded holes;
   said shaft having a diameter substantially smaller than a diameter of said threaded end;
   said light-load adjustment screw being insertable into either end of said light-load adjust by threading said shaft completely through either one of said first and second threaded holes and into the other thereof, the smaller diameter of said shaft being effective to avoid interference with adjustment;
   a spring finger having first and second ends;
   means for rigidly affixing said first end to said voltage stator; and
   means at said second end for resiliently bearing against an edge of said light-load adjust plate at an angle diagonal to a plane of said light load adjust plate, said diagonal angle being effective for displacing said light-load adjust plate in a transverse direction and for rotating said light load adjust plate with respect to said means for permitting slidable motion whereby adjustment backlash is avoided and a stable adjustment is attained.

2. A voltage stator comprising:
   a flange rigidly affixed to said voltage stator;
   a threaded hole in said flange;
   a light-load adjust plate;
   means for permitting slidable motion of said light-load adjust plate with respect to said voltage stator;
   a light-load adjust nut rigidly affixed to said light-load adjust plate and having a second threaded hole therein generally aligned with said first threaded hole;
   threads in said first and second holes having substantially equal diameters and thread pitches;
   resilient means biasing said light-load adjust nut with respect to said flange;
   a light-load adjustment screw having a shaft, a head and a threaded end;
   said threaded end being selectively engageable with said first and second threaded holes;
   said shaft having a diameter substantially smaller than a diameter of said threaded end;
   said light-load adjust screw being insertable into either end of said light-load adjust by threading said shaft completely through either one of said first and second threaded holes and into the other thereof, the smaller diameter of said shaft being effective to avoid interference with adjustment;
   means for avoiding backlash in motion of said light-load adjust plate;
   a phase-lag adjust;
   means for rigidly affixing said phase-lag adjust to said voltage stator;
   said phase-lag adjust including third and fourth threaded holes in opposed ends of said phase-lag adjust;
   axes of said third and fourth threaded holes being substantially parallel to axes of said first and second threaded holes;
   phase-lag adjust screw;
   said third and fourth threaded holes having diameters and thread pitches permitting said phase-lag adjust screw to be selectively inserted therein;
   said light-load adjust being adjustable in the same sense by rotation of said light-load adjust screw in a same rotational direction facing said light-load adjust screw regardless whether said light-load adjust screw is inserted into said first or said second threaded hole; and;
   said phase-lag adjust being adjustable in the same sense by rotation of said phase-lag adjust screw in a same rotational direction facing said phases-lag adjust screw regardless whether said phase-lag adjust screw is inserted into said third or fourth threaded hole, whereby said phase-lag and said light-load adjust screws may both be disposed for adjustment from the same end of said voltage stator, and the end of said voltage stator so employed may be selected from either end thereof, whereby a single voltage stator may be employed with either end facing a user for adjustment thereof.

* * * * *